(12) United States Patent
Cho et al.

(10) Patent No.: US 8,952,510 B2
(45) Date of Patent: Feb. 10, 2015

(54) SEMICONDUCTOR CHIP AND FILM AND TAB PACKAGE COMPRISING THE CHIP AND FILM

(71) Applicant: Samsung Electronics Co., Ltd., Gyeonggi-do (KR)

(72) Inventors: Young-Sang Cho, Yongin-si (KR); Chang-Sig Kang, Hwaseong-si (KR); Dae-Woo Son, Cheonan-si (KR); Yun-Seok Choi, Hwaseong-si (KR); Kyong-Soon Cho, Goyang-si (KR); Sang-Heui Lee, Cheonan-si (KR)

(73) Assignee: Samsung Electronics Co., Ltd., Samsung-ro, Yeongtong-gu, Suwon-si Gyeonggi-do (KR)

( * ) Notice: Subject to any disclaimer, the term of this patent is extended or adjusted under 35 U.S.C. 154(b) by 0 days.

(21) Appl. No.: 14/061,784

(22) Filed: Oct. 24, 2013

(65) Prior Publication Data

US 2014/0084430 A1 Mar. 27, 2014

Related U.S. Application Data

(62) Division of application No. 13/034,973, filed on Feb. 25, 2011, now Pat. No. 8,575,735.

(30) Foreign Application Priority Data

Feb. 26, 2010 (KR) ........................ 10-2010-0017747

(51) Int. Cl.
*H01L 23/495* (2006.01)
*H01L 23/00* (2006.01)
*H01L 23/498* (2006.01)

(52) U.S. Cl.
CPC ............ *H01L 24/50* (2013.01); *H01L 23/4985* (2013.01); *H01L 24/06* (2013.01);

(Continued)

(58) Field of Classification Search
CPC ...... H01L 24/06; H01L 24/50; H01L 23/4985
USPC .......... 257/676, 773, 782, E23.031, E23.034; 438/123
See application file for complete search history.

(56) References Cited

U.S. PATENT DOCUMENTS 4,967,261 A 10/1990 Niki et al.
5,016,082 A 5/1991 Roth (Continued)

FOREIGN PATENT DOCUMENTS

JP 11-121542 4/1999
JP 2002-246410 8/2002
KR 10-2006-0058955 A 11/2004

*Primary Examiner* — Allan R Wilson
(74) *Attorney, Agent, or Firm* — Muir Patent Consulting, PLLC

(57) ABSTRACT

A semiconductor chip for a TAB package includes a surface including a set of input pads connected to internal circuitry of the chip and for receiving external signals The surface includes output pads. A plurality of input pads are adjacent a first edge and are in a first row substantially parallel to the first edge and extending in a first direction; a plurality of first output pads are adjacent a second edge, and are in a second row substantially parallel to the second edge and extending in the first direction; and a plurality of second output pads are located between the first row and the second row. The plurality of second output pads include first and second outermost pads located a certain distance from a respective third edge and fourth edge, and first and second inner pads located a greater distance from the respective third edge and fourth edge.

21 Claims, 8 Drawing Sheets

(52) U.S. Cl.
CPC .............. *H01L2224/0405* (2013.01); *H01L 2224/06155* (2013.01); *H01L 2224/14155* (2013.01); *H01L 2224/16227* (2013.01); *H01L 2224/73204* (2013.01); *H01L 2924/01029* (2013.01); *H01L 2924/01078* (2013.01); *H01L 2924/01079* (2013.01); *H01L 2924/01082* (2013.01); *H01L 2924/14* (2013.01); *H01L 2924/01005* (2013.01); *H01L 2924/01006* (2013.01); *H01L 2924/01033* (2013.01); *H01L 2924/01047* (2013.01); *H01L 2924/0105* (2013.01); *H01L 2224/16225* (2013.01)
USPC .............. 257/676; 257/773; 257/E23.034; 438/123

(56) References Cited

U.S. PATENT DOCUMENTS

| | | | |
|---|---|---|---|
| 5,287,000 A | 2/1994 | Takahashi et al. | |
| 5,545,920 A | 8/1996 | Russell | |
| 5,637,915 A | 6/1997 | Sato et al. | |
| 5,866,940 A | 2/1999 | Takata et al. | |
| 6,271,821 B1 | 8/2001 | Sung et al. | |
| 6,608,368 B2 | 8/2003 | Ohashi | |
| 7,329,597 B2 | 2/2008 | Chung et al. | |
| 7,466,013 B2 | 12/2008 | Shiah | |
| 7,821,115 B2 * | 10/2010 | Sasaki et al. | 257/668 |
| 8,350,158 B2 | 1/2013 | Chung et al. | |
| 8,633,062 B2 * | 1/2014 | Punzalan et al. | 438/123 |
| 2004/0108594 A1 * | 6/2004 | Toyosawa | 257/734 |
| 2004/0155323 A1 | 8/2004 | Murakami et al. | |
| 2007/0040247 A1 | 2/2007 | Lee et al. | |
| 2007/0126090 A1 * | 6/2007 | Sasaki et al. | 257/668 |
| 2008/0185693 A1 * | 8/2008 | Punzalan et al. | 257/666 |
| 2009/0096069 A1 | 4/2009 | Ishimaru et al. | |
| 2010/0038117 A1 | 2/2010 | Chung et al. | |
| 2010/0320500 A1 * | 12/2010 | Kang et al. | 257/99 |

* cited by examiner

SEMICONDUCTOR CHIP AND FILM AND TAB PACKAGE COMPRISING THE CHIP AND FILM

CROSS-REFERENCE TO RELATED APPLICATION

This application claims priority to and is a division of U.S. patent application No. 13/034,973 filed on Feb. 25, 2011 which claims priority under 35 U.S.C. 119 from Korean Patent Application No. 10-2010-0017747 filed on Feb. 26, 2010 in the Korean Intellectual Property Office, the contents of each of which in their entirety are herein incorporated by reference.

BACKGROUND

1. Field

The disclosed embodiments relate to a semiconductor chip, a film, and a tape automated bonding (TAB) package comprising the chip and the film.

2. Description of the Related Art

There are numerous types of semiconductor packaging technologies. Specifically, TAB (Tape Automated Bonding) technology using an inner bead bonding (ILB) process has increasingly drawn attention.

The TAB technique may provide a reel-to-reel package assembly using a reel type tape wiring board, and a package manufactured by the TAB technique is generally referred to as a TAB package. The TAB package may be classified into a chip on board (COB) and a tape carrier package (TCP).

The TAB package, which is suitable for realizing thinness and a fine pitch, has been used in a wide range of applications, examples of which include in inner connections, a watch, or a calculator. Nowadays, the TAB package is widely used as a driver IC for a liquid crystal display, which is also referred to as a display driver IC (DDI), and a micro-processor for a personal computer.

As semiconductor devices are becoming finer and thinner, demand for finer pitch TAB packages is continuously on the rise. However, existing fine pitch TAB packages typically benefit from some minimal amount of routing space for lead wires, which helps avoid signal interference and manufacturing defects such as short circuits. In addition, thicker lead wires may be desirable to avoid defects such as cracks of lead wires, which can adversely affect product reliability. In pursuit of thinner, miniaturized devices, manufacturers may decrease the routing space (i.e., pitch) between lead wires and/or decrease the width of lead wires, both of which may decrease product performance and reliability. Alternative solutions are therefore desirable.

SUMMARY

Example embodiments disclosed herein provide a semiconductor chip for a TAB package having improved reliability.

Example embodiments also provide a film for a TAB package having improved reliability.

Example embodiments additionally provide a TAB package having improved reliability.

Additional embodiments will be set forth in pan in the description which follows, but are not limited thereto. Modifications may be made to the disclosed embodiments without departing front the spirit and scope of the invention set forth in the claims below.

One embodiment includes a semiconductor chip for a tape automated bonding (TAB) package. The semiconductor chip comprises a connection surface including a set of input pads connected to internal circuitry of the chip and for conveying external signals to the internal circuitry, the set of input pads comprising all of the input pads on the chip. The connection surface includes a set of output pads connected to internal circuitry of the chip and for conveying internal chip signals to outside the chip, the set of output pads comprising all of the output pads on the chip. The connection surface includes a first edge and a second edge that are substantially parallel to each other and are opposite each other on a respective first side and second side of the chip, and a third edge and fourth edge that are substantially perpendicular to the first and second edges, and are opposite each other on a respective third side and fourth side of the chip. A plurality of input pads of the set of input pads are adjacent the first edge, and are arranged in a first row substantially parallel to the first edge and extending in a first direction; a plurality of first output pads of the set of output pads are adjacent the second edge, and are arranged in a second row substantially parallel to the second edge and extending in the first direction; and a plurality of second output pads of the set of output pads are located between the first row and the second row. The plurality of second output pads include at least first and second outermost pads located a certain distance from the respective third edge and fourth edge, and at least first and second inner pads located a greater distance from the respective third edge and fourth edge than the first and second outermost pads.

Another embodiment includes a film for a TAB package. The film includes an input terminal, an output terminal, and a chip-mounting area for mounting over a surface of a chip that includes a first edge and a second edge that are substantially parallel to each other and are opposite each other on a respective first side and second side of the chip. The chip-mounting area includes an inner area and an outer area, wherein the outer area includes at least a first portion located, between the inner area and a first outer border of the chip-mounted area that corresponds to the first edge, and at least a second portion located between the inner area and a second outer border of the chip-mounted area that corresponds to the second edge. The film further comprises a plurality of input leads extending from the first portion of the outer area of the chip-mounted area to the input terminal, the input leads arranged to connect to corresponding input pads of the chip; a plurality of first output leads extending from the second portion of the outer area of the chip-mounted area to the output terminal, the first output leads arranged to connect to corresponding first output pads of the chip; and a plurality of second output leads extending from the inner area of the chip-mounted area to the output terminal, the second output leads arranged to connect to corresponding second output pads of the chip. At least part of at least a first of the plurality of second output leads extends from the inner area of the chip-mounted area in a direction toward the first edge.

Another embodiment includes a TAB package comprising a film and a semiconductor chip mounted on the film. The semiconductor chip comprises a connection surface including a first edge and a second edge that are substantially parallel to each other and are opposite each other on a respective first side and second side of the chip, and a third edge and fourth edge that are substantially perpendicular to the first and second edges, and are opposite each other on a respective third side and fourth side of the chip; a plurality of input pads adjacent the first edge and arranged in a first direction; a plurality of first Output pads adjacent the second edge and arranged in the first direction; and a plurality of second output pads located between the plurality of input pads and the plurality of first output pads, and including at least first and second outermost pads located a certain distance from the respective third edge and fourth edge, and at least first and second inner pads located a greater distance from the respective third edge and fourth edge than the first and second outermost pads. The film comprises: an input terminal and an output terminal; a chip-mounted area including an inner area and an outer area, wherein the outer area includes at least a first portion located between the inner area and a first outer border of the chip-mounted area that corresponds to the first edge, and at least a second portion located between the inner area and a second outer border of the chip-mounted area that corresponds to the second edge; a plurality of input leads extending from the first portion of the outer area of the chip-mounted area to the input terminal; a plurality of first output leads extending from the second portion of the outer area of the chip-mounted area to the output terminal; and a plurality of second output leads extending from the inner area of the chip-mounted area to the output terminal. The plurality of input pads are connected respectively to the plurality of input leads, the plurality of first output pads are connected respectively to the plurality of first output leads, and the plurality of second output pads are connected respectively to the plurality of second output leads.

In a further embodiment, a method of manufacturing a TAB package is disclosed. The method includes aligning a film and a semiconductor chip so that a plurality of input pads of the semiconductor chip align with a plurality of input leads of the film, a plurality of first output pads of the semiconductor chip align with a plurality of first output leads of the film, and a plurality of second output pads of the semiconductor chip align with a plurality of second output leads of the film; and connecting the plurality of input pads to the plurality of input leads, the plurality of first output pads to the plurality of first output leads, and the plurality of second output pads to the plurality of second output leads. The semiconductor chip comprises a connection surface including a first edge and a second edge that are substantially parallel to each other and are opposite each other on a respective first side and second side of the chip, and a third edge and fourth edge that are substantially perpendicular to the first and second edges, and are opposite each other on a respective third side and fourth side of the chip; the plurality of input pads, arranged adjacent the first edge and arranged in a first direction; the plurality of first output pads, arranged adjacent the second edge and arranged in the first direction; and the plurality of second output pads, located between the plurality of input pads and the plurality of first output pads, and including at least first and second outermost pads located a certain distance from the respective third edge and fourth edge, and at least first and second inner pads located a greater distance from the respective third edge and fourth edge than the first and second outermost pads. The film comprises an input terminal and an output terminal a chip-mounted area including an inner area and an outer area, wherein the outer area includes at least a first portion located between the inner area and a first outer border of the chip-mounted area that corresponds to the first edge, and at least a second portion located between the inner area and a second outer border of the chip-mounted area that corresponds to the second edge; the plurality of input leads, extending from the first portion of the outer area of the chip-mounted area to the input terminal; the plurality of first output leads, extending from the second portion of the outer area of the chip-mounted area to the output terminal.; and the plurality of second output leads, extending from the inner area of the chip-mounted area to the output terminal.

BRIEF DESCRIPTION OF THE DRAWINGS

The above and other features and advantages of the disclosed embodiments will become more apparent by describing in detail the following examples, with reference to the attached drawings in which.

DETAILED DESCRIPTION

Figure 1:
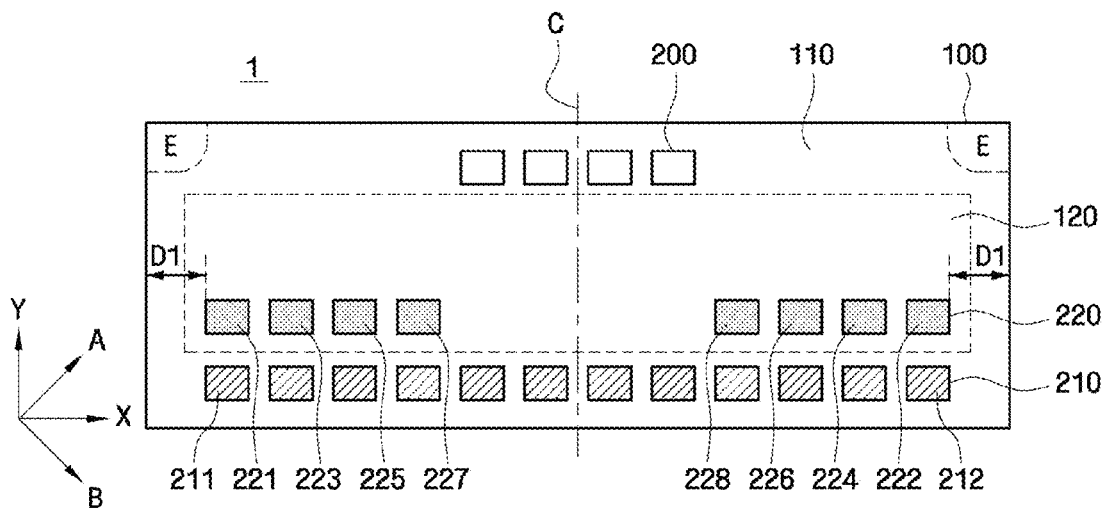
FIG. 1 is a diagram illustrating an exemplary arrangement of input/output pads of a semiconductor chip for a TAB package in accordance with one embodiment.

Advantages and features of the TAB package described herein and methods of manufacturing the same may be understood more readily by reference to the following detailed description of various exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concepts disclosed herein to those skilled in the art, and the present invention will only be defined by the appended claims. In the drawings, the size and relative sizes of elements, layers, and regions may be exaggerated for clarity.

Like numbers refer to like elements throughout. As used herein, the term "and/or" includes any and all combinations of one or more of the associated listed items.

The terminology used herein is for the purpose of describing particular embodiments only and is not intended to be limiting. As used herein, the singular forms "a", "an" and "the" are intended to include the plural firms as well, unless the context clearly indicates otherwise. It will be further understood that the terms "comprises," "includes," "made of," or similar terms, when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure.

Example embodiments are described herein with reference to illustrations that are schematic illustrations of idealized embodiments. As such, variations from the shapes of the illustrations as a result, for example, of manufacturing techniques and/or tolerances, are to be expected. Thus, embodiments disclosed herein should not be construed as limited to the particular shapes or relative sizes of regions illustrated herein but are to include deviations in shapes and relative sizes that result, for example, from manufacturing. For example, a region illustrated or described as flat or straight may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the disclosure.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted, in an idealized or overly formal sense unless expressly so defined herein.

Hereinafter, a semiconductor chip fir a TAB package in accordance with an example embodiment will be described with reference to FIG. 1 and other figures. In example embodiments that follow, the semiconductor chip 1 may be a display driver IC (DDI) used for an image display device, but it is not limited thereto and may comprise another type of chip having the features described herein.

FIG. 1 is a diagram illustrating an exemplary arrangement of input/output pads of a semiconductor chip for a TAB package in accordance with one embodiment.

Referring to FIG. 1, the semiconductor chip 1 may include a connection surface 100, a plurality of input pads 200, a plurality of first output pads 210, and a plurality of second output pads 220. Other features and elements of the chip are not shown.

The connection surface 100 may be connected to a film for a TAB package in a subsequent process and may be a surface where the input/output pads 200 to 220 are formed. In one embodiment, the connection surface 100 includes all of the connection pads of the chip, and includes the input and output pads 200 to 220. The connection surface 100 may include an inner area 120, such as a center area or portion of the chip, and an outer area 110, such as an edge area near the edges of the chip, as shown in FIG. 1. The inner area 120 may be a central area of the connection surface 100 and the outer area 110 may be a peripheral area of the connection surface 100, as shown in FIG. 1. For ease of explanation, the inner area, or center area 120 (though it need not be in the exact center of the chip), may be described herein as including an outer border that borders on the outer or edge area 120, and the outer or edge area 110 may be described as being located or positioned between the inner area 120 and the edge of the connection surface 100 of the semiconductor chip 1.

In one embodiment, the connection strike 100 of semiconductor chip 1 includes four edges, including a first edge and a second edge that are substantially parallel to each other and are opposite each other on a respective first side and second side of the chip, and a third edge and fourth edge that are substantially perpendicular to the first and second edges, and are opposite each other on a respective third side and fourth side of the chip. In one embodiment, the first and second edges are longer than the third and fourth edges. The third and fourth edges may be referred to as short-side edges. These features are described further below.

In one embodiment, the semiconductor chip 1 includes a set of input pads that comprise all of the input pads on the chip. The set of input pads may be located on the connection surface 100. A subset of the full set of input pads may include the plurality of input pads 200. Input pads 200 are pads that receive external input signals applied to the semiconductor chip 1 and supply the same to the semiconductor chip 1. For example, input pads 200 may be connected to internal circuitry (not shown) in semiconductor chip 1, and may convey external signals from outside the chip to the internal circuitry. For the purposes of this disclosure, input pads 200 may receive different types of signals, such as power (including source voltage and ground voltage), address, command, and/or data signals.

In one embodiment, input pads 200 may be arranged in the edge area 110 of the connection surface 100, as shown in FIG. 1. For example, input pads 200 may be arranged adjacent to a first edge of the semiconductor chip 1, and may be arranged in a row parallel to the first edge. The input pads 200 may thus extend in a first direction (such as parallel to the first edge) between the two edges perpendicular to the first edge (e.g., the third and fourth edges as described above). The first direction may vary, however, such that the input pads 200 may be arranged parallel to the edge, substantially parallel to the edge (e.g., within 1-5% variation), slightly staggered, etc., according to design or manufacturing variations. Since a distance between each of the input pads 200 and an external input signal supply device (not shown) is reduced by arranging the plurality of input pads 200 in the edge area 110 of the connection surface 100 in the above-described manner, the input signals can be received from the external input signal supply device not shown) more efficiently.

In one embodiment, the semiconductor chip 1 includes a set of output pads that comprise all of the output pads on the chip. The set of output pads may be located on the connection surface 100. A subset of the full set of output pads may include first output pads 210. Another subset of the output pads may include second output pads 220.

The first output pads 210 are pads that supply output signals from the semiconductor chip 1 to the external output device (not shown). For example, first output pads 210 may be connected to internal circuitry (not shown) in semiconductor chip 1, and may convey internal signals from inside the chip to outside the chip. For the purposes of this disclosure, first output pads 210 may convey different types of output signals, such as address, command, and/or data signals. In one embodiment, the output signals are sent to an external output device (not shown), such as, for example, a display device for displaying images. The output signals may be used to drive the display device. However, aspects of the disclosed embodiments are not limited to use with a display device.

In one embodiment, first output pads 210 may be arranged in the edge area 110 of the connection surface 100, as shown in FIG. 1. For example, first output pads 210 may be arranged adjacent to a second edge of the semiconductor chip 1, and may be arranged in a row parallel to the second edge. The first output pads 210 may thus extend in a first direction (such as parallel to the second edge) between the two edges perpendicular to the second edge (e.g., the third and fourth edges as described above). The first direction may vary, however, such that the first output pads 210 may be arranged parallel to the edge, substantially parallel to the edge (e.g., within 1-5% variation), slightly staggered, etc., according to design or manufacturing variations. Since a distance between each of the first output pads 210 and the external output device (not shown) is reduced by arranging the first output pads 210 in the edge area 110 of the connection surface 100 in the above-described manner, the output signals can be supplied to the external output device (not shown) more efficiently.

Stated in another way, referring to FIG. 1, in the semiconductor chip 1 for a TAB package in accordance with an example embodiment, the input pads 200 are arranged at a first portion of the edge area 110 located at one side of the edge area 110 of the connection surface 100, and the first output pads 210 are arranged at a second portion of the edge area 110 located at the other side of the edge area 110 of the connection surface 100. That is, the input pads 200 may be arranged opposite to the first output pads 210 in the edge area 110 of the connection surface 100, as shown in FIG. 1.

In more detail, in the semiconductor chip 1 for a TAB package in accordance with an example embodiment, as shown in FIG. 1, the input pads 200 may be arranged to be aligned in a first direction (for example, in the X-direction) at one side of the edge area 110 of the connection surface 100, and the first output pads 210 may be arranged to be aligned in the first direction (for example, in the X-direction) at the other side of the edge area 110 of the connection surface 100. That is, the input pads 200 and the first output pads 210 may be spaced apart from each other and arranged parallel to each other in the first direction (for example, in the X-axis direction).

The second output pads 220 may supply output signals from the semiconductor chip 1 to an external output device (not shown). For example, second output pads 220 may be connected to internal circuitry (not shown) in the semiconductor chip 1, and may convey internal signals from inside the chip to outside the chip. For the purposes of this disclosure, second output pads 220 may convey different types of output signals, such as address, command, and/or data signals to an external output device. In one embodiment, the external output device (not shown) may also be a display device for displaying images. In the semiconductor chip 1 for a TAB package in accordance with an example embodiment, the second output pads 220 may be arranged in the center area 120 of the connection surface 100, as shown in FIG. 1.

In one embodiment, the second output pads 220 are arranged in the center area 120 of the connection surface 100 to be aligned in the first direction (for example, in the X-axis direction), as shown in FIG. 1. In this configuration, the of second output pads 220 are located between a first row that includes the input pads 200 and a second row that includes the first output pads 210, and include at least first and second outermost pads (221 and 222) located a certain distance (D1 and D2) from the respective third edge and fourth edge, and at least first and second inner pads (223-228) located a greater distance from the respective third edge and fourth edge than the first and second outermost pads. As such, at least one of the first output pads 210 may be between at least one of the second output pads 220 and an edge of the semiconductor chip 1. Furthermore, the first and second outermost pads (221 and 222) may be aligned, either partly or wholly, with a first and second outermost pad (211 and 212) of the plurality of first output pads, along a direction perpendicular to the edge of the semiconductor chip, such as the X direction.

In more detail, as shown in FIG. 1, the second output pads 220 are arranged to be aligned in the first direction (for example, in the X-axis direction) so as to be symmetrical to each other with respect to a line perpendicular to the X-axis direction, such as the center line C that bisects the connection surface 100 in the center of the connection surface 100. The second output pads 220 of the semiconductor chip 1 for a TAB package in accordance with an example embodiment may not be formed in a peripheral edge portion of the connection surface 100 (such as, for example, corner portion E or an edge portion along the first, second, third, or fourth edges of the connection surface 100). In one embodiment, all or a at least a high percentage (e.g., 80% or more) of the pads adjacent the first edge are input pads, and all or at least a high percentage (e.g., 80% or more) of the pads adjacent the second edge are output pads.

Although FIG. 1 illustrates that the second output pads 220 are arranged in the center area 120 of the connection surface 100 to be aligned in the first direction (for example, in the X-axis direction), aspects of the present disclosure are not limited thereto.

Hereinafter, the second output pads 220 of the semiconductor chip 1 for a TAB package in accordance with modified example embodiments will be described with reference to FIGS. 2-4.

Figure 2:
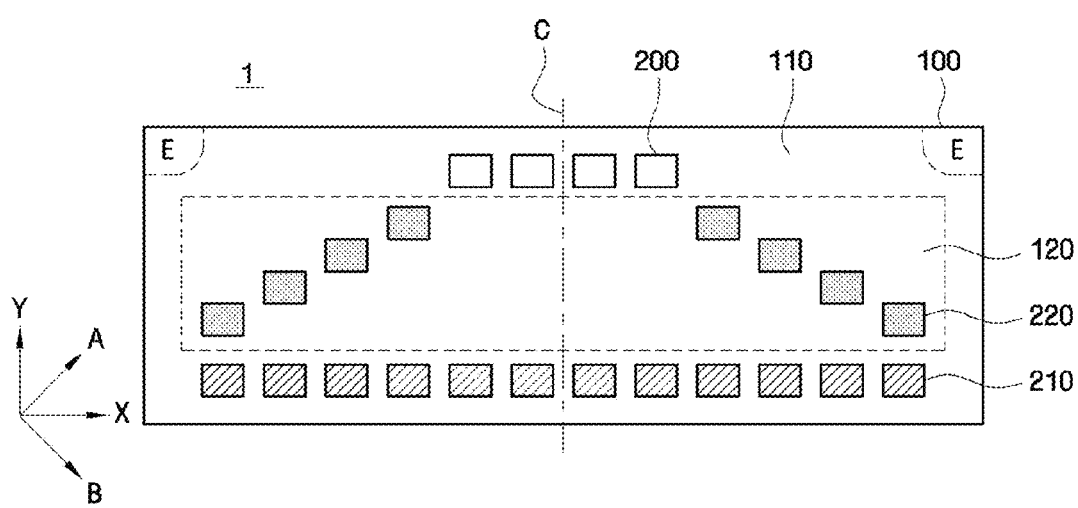
FIG. 2 is a diagram illustrating another exemplary arrangement of input/output pads of a semiconductor chip for a TAB package in accordance with a modified embodiment.

FIG. 2 is a diagram illustrating art exemplary arrangement of input/output pads of a semiconductor chip for a TAB package in accordance with a modified example embodiment.

Referring to FIG. 2, the second output pads 220 may be arranged in center area 120 of the connection surface 100. In more detail, the second output pads 220 may be arranged in center area 120 of the connection surface 100 to be aligned in a second direction (for example, in the A or B direction), as shown in FIG. 2. In more detail, as shown in FIG. 2, the second output pads 220 are arranged in the center area 120 of the connection surface 100 to be aligned in a second direction (for example, in the A or B direction) so as to be symmetrical to each other with respect to a line, such as the center line C, that bisects the connection surface 100. For example, the A or B directions may include diagonal directions with respect to the edges of the connection surface 100 of the semiconductor chip 1. Like in the previous example embodiment, the second output pads 220 of the semiconductor chip 1 for a TAB package in accordance with an example embodiment may not be formed in a peripheral edge portion of the connection surface 100.

As described above, if the second output pads 220 are arranged in the center area 120 but not in the corner portion E of the connection surface 100, a routing space (also known as pitch or trace space) between lead wires, that is, a distance between leads, can be enlarged, and/or a lead width can be increased, reducing the interference between leads and/or defects of leads, thereby ultimately improving the product reliability.

Next, semiconductor chips for a TAB package in accordance with another example embodiment and its modified example embodiment will be described with reference to FIGS. 3 and 4.

Figure 3:
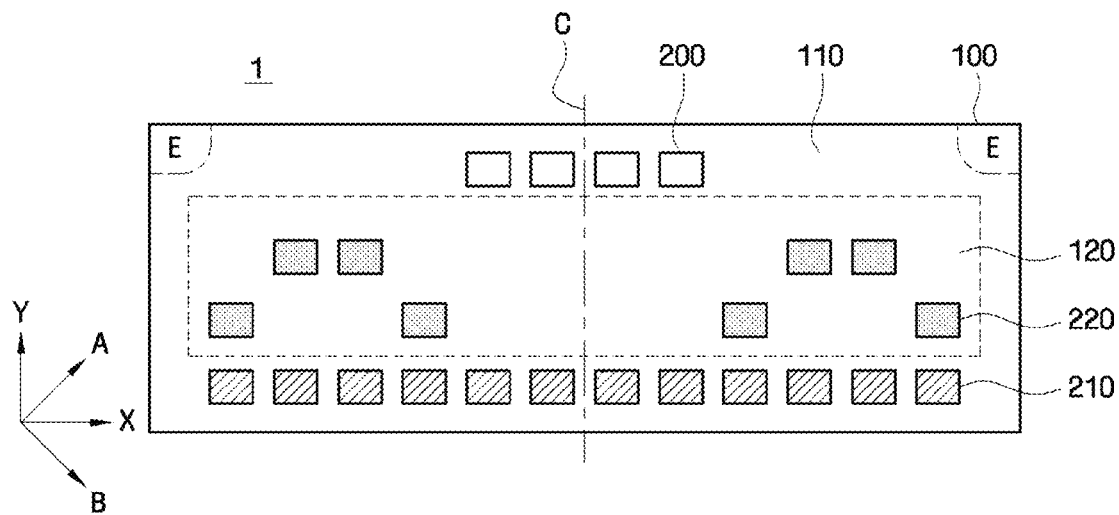
FIGS. 3 and 4 are diagrams illustrating exemplary arrangements of input output pads of semiconductor chips for a TAB package in accordance with other exemplary embodiments.
Figure 4:
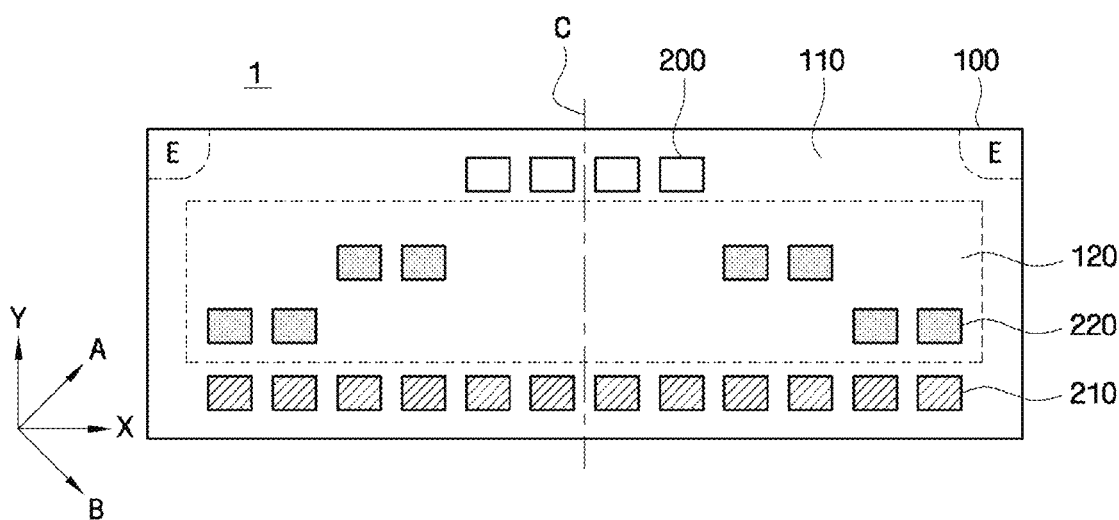

FIGS. 3 and 4 are diagrams illustrating arrangements of input/output pads of semiconductor chips for a TAB package in accordance with another example embodiment and its modified example embodiment.

In the description that follows, for the purposes of brevity, contents which are the same as, or similar to those of the previous example embodiment, will be omitted herein. That is, the following discussion will relate primarily to only the differences between the previous example embodiment and the current example embodiment, and as to undefined portions or elements in the semiconductor chip 1 for a TAB package in accordance with a modified example embodiment, the contents of the previous example embodiment may be referred to.

Referring to FIGS. 3 and 4, in the semiconductor chips for a TAB package in accordance with another example embodiment and its modified example embodiment, the second output pads 220 may be arranged so as not to be aligned in a first direction (for example, in the X-direction) or in a second direction (for example, in the A or B direction). That is, the second output pads 220 may be arranged in the center area 120 but are not formed in the edge area 110 or corner portion portion E of the connection surface 100, while they are arranged to be symmetrical to each other with respect to the line C (e.g., center line) that bisects the connection surface 100. As shown in FIG. 3, the second output pads 220 may be positioned in a semi-circular shape. As shown in FIG. 4, the second output pads 220 may be positioned in a stepwise configuration extending from near the outside edge portion of the chip to a middle of the chip. Although FIGS. 3 and 4 illustrate only two examples, there may be numerous modifications thereof, but aspects of the present invention are not limited to those illustrated herein.

As described above, there are shown various examples of configurations for input and output pads on the connection surface 100 of semiconductor chip 1. For example, in the configurations shown in FIGS. 1-4, embodiments are depicted in which a majority of output pads on the connection surface 100 are located on a particular side of the semiconductor chip 1. For example, embodiments can include configurations where all or substantially all (e.g., upwards of 95%) of the output pads on the chip are located on a particular side of the chip (e.g., the bottom half of the chip as shown in FIG. 1) or are located in the combined areas adjacent a first edge of the chip and in the center area of the chip, or where at least a certain majority percentage of the output pads on the chip are located on a particular side of the chip or are located in the combined areas adjacent a first edge of the chip and in the center area of the chip (e.g., 60%, 80%, etc.). Furthermore, in certain embodiments, all of the pads along one edge of the semiconductor chip 1 are output pads, and/or all of the pads along an opposite edge of the chip are input pads. Further, in certain embodiments, certain input pads may be replaced with output pads, and vice versa, so long as the leads (described further below) may still be arranged in the advantageous manner described herein.

Next, a film for a TAB package in accordance with an example embodiment will be described with reference to FIG. 5.

Figure 5:
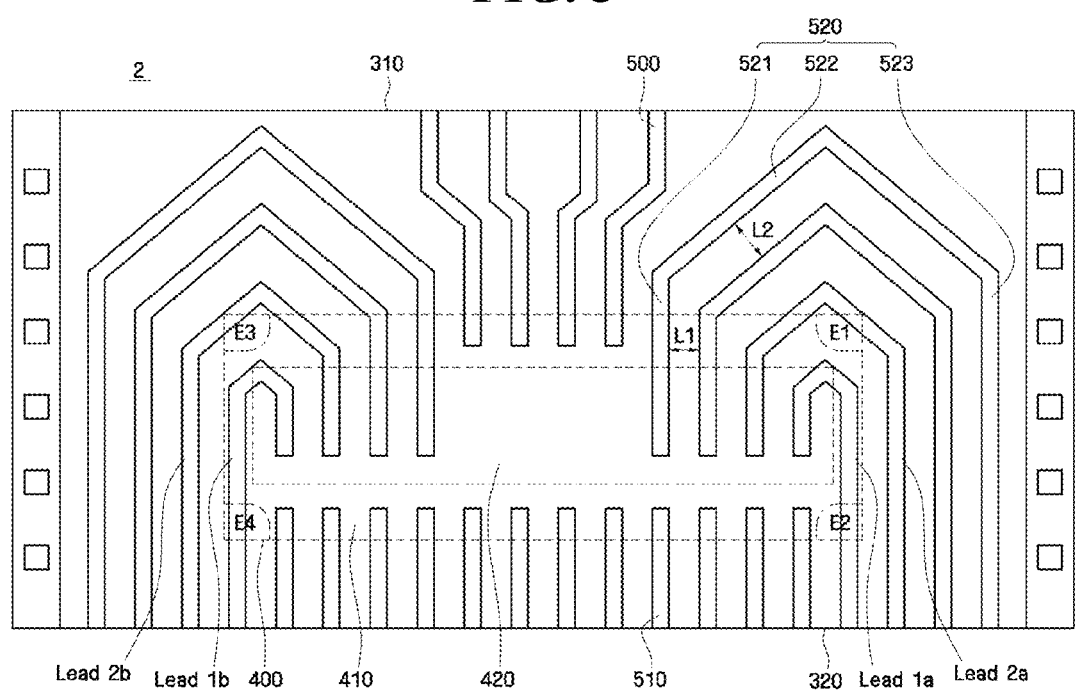
FIG. 5 is a diagram illustrating an exemplary arrangement of input/output leads of a film for a TAB package in accordance with one embodiment.

FIG. 5 is a diagram illustrating an exemplary arrangement of input/output leads of a film for a TAB package in accordance with an example embodiment.

Referring to FIG. 5, the film 2 may include an input terminal 310, an output terminal 320, a chip-mounting area 400, a plurality of input leads 500, a plurality of first output leads 510, and a plurality of second output leads 520. The film may also include other elements not shown.

The input terminal 310 may be a first end portion of the film 2, where an external input signal supply device (not shown) is disposed, and the output terminal 320 may be a second end portion of the film 2, where an external output device (not shown) is disposed. In one embodiment, the input terminal 310 and output terminal 320 are on opposite sides and on the longer sides of the film (e.g., top and bottom edges as depicted in FIG. 5).

The chip-mounting area 400, in one embodiment, is an area where the semiconductor chip (1 of FIG. 1) is to be mounted, and may include a center area 420 (i.e., inner area) and an edge area 410 (e.g., outer area). If the semiconductor chip (1 of FIG. 1) is mounted on the chip-mounting area 400, the center area 420 and the edge area 410 of the chip-mounting area 400 may correspond to the center area (120 of FIG. 1) and the edge area (110 of FIG. 1) of the semiconductor chip (1 of FIG. 1). As such, the borders of the center area 120 of the connection surface 100 of semiconductor chip 1 may align with borders of the center area 420 of chip mounting area 400 of the film 2, and the edge of the connection surface 100 of semiconductor chip 1 may align and overlap with the border surrounding the edge area 410 of chip-mounting area 400.

In one embodiment, the input leads 500 may be formed to extend in a direction from a first portion of the edge area 410 of the chip-mounted area 400 (e.g., an area corresponding to the edge area at which input pads 200 are located) toward a first edge of the chip-mounting area 400 and to the input terminal 310. Although FIG. 5 illustrates four input leads 500, aspects of the present disclosure are not limited thereto. The number of the input leads 500 may be increased or decreased as needed.

The first output leads 510 may be formed to extend in a direction from a second portion of the edge area 410 of the chip-mounted area 400 (e.g., a portion opposite the first portion, and corresponding to the edge area at which first output pads 210 are located) toward a second edge of chip-mounting area 400 (e.g., an edge opposite the first edge) and to the output terminal 320. Although FIG. 5 illustrates 12 first output leads 510, aspects of the present disclosure are not limited thereto. The number of the first output leads 510 may be increased or decreased as needed. A spacing, or pitch, between input leads and between output leads may be set to a spacing that minimizes interference, but still allows for thick enough lines to avoid undesired lead cracking.

In the film 2 for a TAB package according to an example embodiment of the present disclosure, the input leads 500 may be formed to extend from one side of the edge area 410 of the chip-mounted area 400 to the input terminal 310, and the first output leads 510 may be formed to extend from the other side of the edge area 410 of the chip-mounted area 400 to the output terminal 320. That is to say, as shown in FIG. 5, the input leads 500 and the first output leads 510 may be formed to extend from opposite sides of edge area 410 of the chip-mounted area 400 to the input terminal 310 and the output terminal 320, respectively.

In one embodiment, the second output leads 520 may be formed to extend from the center area 420 of the chip-mounted area 400 to the output terminal 320. In more detail, referring to FIG. 5, each of the second output leads 520 may include a first straight line portion 521 extending in a straight line from the center area 420 of the chip-mounted area 400 toward the border of the center area 420 and toward the input terminal 310, a bent portion 522 extending from the first straight line portion 521 (e.g., end of the straight line portion) so as to be bent from the first straight line portion 521, and a second straight line portion 523 extending in a straight line from the bent portion 522 (e.g., end of the bent portion) to the output terminal 320. Bent portion 522 may be angled as shown, or may be curved, or may be in another bent arrangement. The straight line portions may be perpendicular to the edge of the chip-mounting area 400, as shown in FIG. 5, but may also be slanted at a different angle. In one embodiment, the straight line portions, and other portions of the leads, are positioned so as to maximize space between the leads, while maintaining a desirable lead thickness and minimizing the amount of space required in the film (e.g., vertical and horizontal dimensions) to house all of the required lead lines.

A distance L2 between the bent portions 522 of the second output leads 520 (e.g., in a direction perpendicular to the bent portions) may be greater than a distance L1 between the first straight line portions 521 of the second output leads 520. That is, the second output leads 520 of the film 2 for a TAB package according to an example embodiment can be spaced to maximally utilize the existing routing space (which has been enlarged due to the location of the leads beginning in the center area 420 rather than in an edge area 410 of the chip-mounting area 400), thereby making the distance L2 between the bent portions 522 of the second output leads 520 greater than the distance L1 between the first straight line portions 521 of the second output leads 520. This spacing beneficially decreases signal interference between leads. Alternatively, instead of increasing the space between bent portions 522, the space can be made the same as the space between straight line portions 521, but the size of the film could be decreased, thereby decreasing the overall size of the TAB package. A combination of greater spacing and smaller film size could be arranged as well.

In one embodiment, the second output leads furthest from the input terminal 310 (e.g., Lead 1a and Lead 1b) can be arranged so that at least part of the lead, such as the second straight line portion 523, is positioned between a first corner area (e.g., E1 or E3) and a second corner area (e.g., E2 or E4) on the short-side edge portions of the chip mounting area 400. In addition, another of the second output leads, such as the next furthest leads from the input terminal 310 (e.g., Lead 2a and Lead 2b), may be positioned so that at least a part of the leads, such as the bent portions 522, are positioned in a corner area (e.g., E1 or E3) of the chip mounting area 400. By placing these leads in these locations, a distance between the border of the chip mounting area 400 and an edge of the film 2 can be decreased, thereby decreasing the TAB package size.

Although FIG. 5 illustrates only the film for a TAB package corresponding to the semiconductor chip for the TAB package according to the example embodiment shown in FIG. 1, aspects of the present disclosure are not limited thereto. Alternatively, films corresponding to semiconductor chips for TAB packages according to other example embodiments shown in FIGS. 2 to 4 may also be fabricated as needed.

Next, a film for a TAB package in accordance with another example embodiment will be described with reference to FIG. 6.

Figure 6:
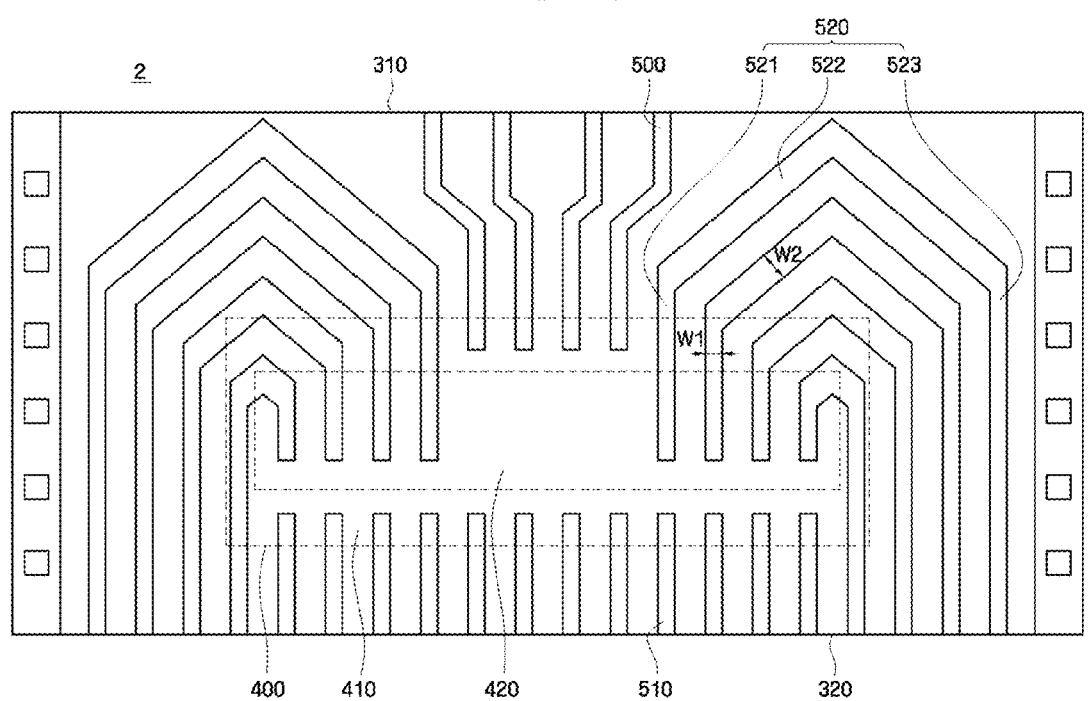
FIG. 6 is a diagram illustrating an exemplary arrangement of input/output leads of a film for a TAB package in accordance with another embodiment.

FIG. 6 is a diagram illustrating an exemplary arrangement of input/output pads of a film for a TAB package in accordance with another example embodiment.

In the description which follows, for the purposes of brevity, contents which are the same as, or similar to those of the previous example embodiment, will be omitted herein. That is the following discussion will relate primarily to only the differences between the previous example embodiment and the current example embodiment, and as to undefined portions or elements in the film for a TAB package in accordance with another example embodiment, the contents of the previous example embodiment may be referred to.

Referring to FIG. 6, in the film 2 for a TAB package in accordance with another example embodiment, a lead width W2 at the bent portion 522 of each of the second output leads 520 may be greater than a lead width W1 at the first straight line portion 521. That is, in the film 2 for a TAB package in accordance with another example embodiment, the second output leads 520 can be arranged to maximally utilize an enlarged routing space by making the lead width W2 at the bent portion 522 greater than the lead width W1 at the first straight line portion 521. In such a case, defects such as lead cracks may be reduced, thereby improving the product reliability.

Like in the previous embodiment, although FIG. 6 illustrates only the film corresponding to the semiconductor chip for a TAB package in accordance with the example embodiment shown in FIG. 1, aspects of the present invention are not limited thereto. Alternatively, films corresponding to semiconductor chips for TAB packages according to other example embodiments shown in FIGS. 2 to 4 may also be fabricated as needed. Further, a combination of thicker leads, greater pitch between leads, and a smaller package size can be arranged.

Next, a TAB package in accordance with an example embodiment of the present disclosure will be described with reference to FIGS. 7 and 8.

Figure 7:
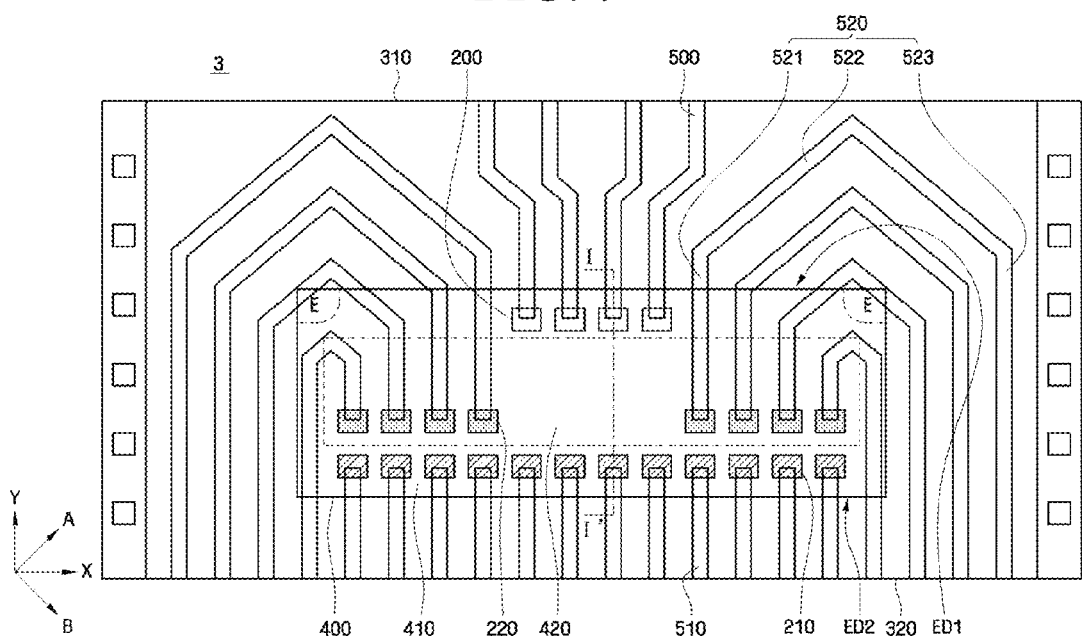
FIG. 7 is a diagram illustrating, an exemplary arrangement of input/output pads and leads of a TAB package in accordance with one embodiment.
Figure 8:
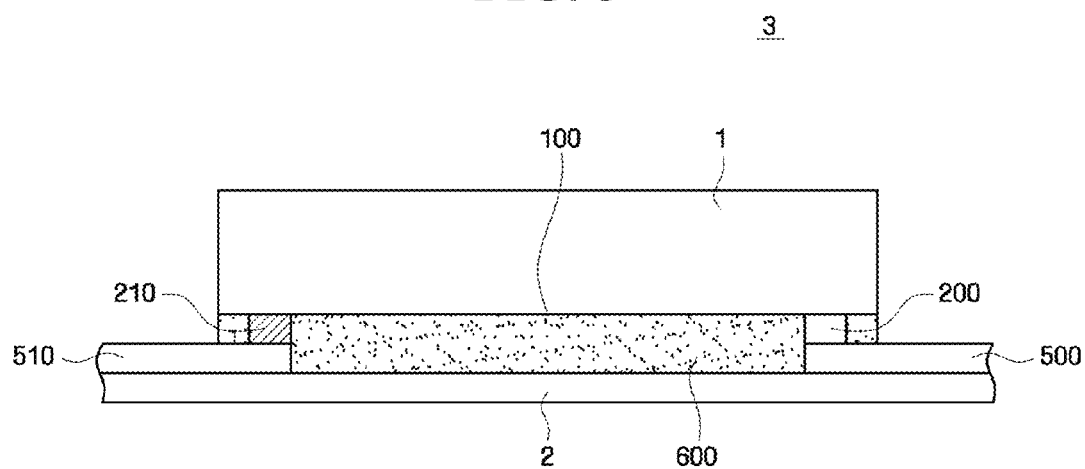
FIG. 8 is an exemplary cross-sectional view taken along a line I-I' in FIG. 7, according to one embodiment.

FIG. 7 is a diagram illustrating an exemplary arrangement of input/output pads and leads of a TAB package 3 in accordance with an example embodiment, and FIG. 8 is an exemplary cross-sectional view taken along a line I-I' in FIG. 7.

Referring to FIGS. 7 and 8, the TAB package may include a film 2 for a TAB package, and a semiconductor chip 1 for a TAB package. As shown in FIG. 7, the semiconductor chip and film 2 may be a semiconductor chip and film for a TAB package in accordance with any of the example embodiments described herein.

In one embodiment, the semiconductor chip 1 may be mounted on the film 2. In more detail, the semiconductor chip 1 in accordance with an example embodiment may be mounted on a chip-mounting area 400 of the film 2 for a TAB package, such that a center area 420 and an edge area 410 of the chip-mounted area 400 correspond to a center area 420 and an edge area 410 of a connection surface 100 of a semiconductor film 1, respectively, and input pads 200 are connected to input leads 500, first output pads 210 are connected to first output leads 510, and second output pads 220 are connected to second output leads 520, respectively. In one embodiment, the input terminal 310 is on the same side of the TAB package as a first edge of the connection surface 100 of semiconductor chip 1 (e.g., an edge adjacent a plurality of input pads), and the output terminal 320 is on an opposite side of the TAB package, corresponding to a second edge of the connection surface 100 of semiconductor chip 1 (e.g., an edge adjacent a plurality of first output pads).

Once connected to input pads 200, input leads 500 may extend from the input pads 200 toward an adjacent first edge of the chip (e.g., edge ED1) and to input terminal 310. Similarly, once connected to first output pads 510, first output leads 510 may extend from the output pads 510 toward an adjacent second edge of the chip (e.g., edge ED2 opposite the first edge) and to output terminal 320. Furthermore, once connected to second output pads 520, second output leads 520 may extend first toward the first edge of the chip and the input terminal, and may then bend away from the input terminal and eventually extend to the output terminal 320. Semiconductor chip 1 may or may not include addition pads or conductive elements on the connection surface 100 adjacent to a third and fourth edge of the semiconductor chip (e.g., the short-side edges), which can affect the positioning of leads in the film 2, as described further below in connection with FIGS. 10A-10D.

As shown in FIG. 8, the pads 200 to 220 and the leads 500 to 520 may be directly connected to each other. A metal coating (not shown), for example, a tin-coated layer, may also be formed on the connection surface of the pads 200 to 220 and the leads 500 to 520. As shown in FIG. 8, an underfill layer 600 made of, for example, resin, may be formed between the film 2 and the semiconductor chip 1. The pads 200 to 220 and the leads 500 to 520 may be made of conductive metals, for example, gold (Au) or copper (Cu).

As described above, in the TAB package in accordance with an example embodiment, the second output pads 220 are arranged in the center area 420 but not in an edge area 410 (such as portions of an edge area adjacent an edge of the semiconductor chip, and/or a corner portion E), thereby securing a wider routing space between the second output leads 520. Accordingly, the film size can be decreased, a lead interval (i.e., pitch) between the second output leads 520 can be increased, thereby improving the product reliability by decreasing signal interference, and/or a lead thickness can be increased to reduce lead cracking that can cause product failure.

Although FIG. 7 illustrates that the semiconductor chip in accordance with an example embodiment of the present disclosure is mounted on the film in accordance with an example embodiment of the present disclosure, aspects of the present invention are not limited thereto.

Therefore, all possible modifications or variations to the above-described embodiments may be made, in which the semiconductor chips described in accordance with the various example embodiments can be mounted on the films described in accordance with the various example embodiments, with certain changes to lead length (e.g., some first straight portions of leads may be shorter in certain embodiments than in other embodiments).

Figure 9:
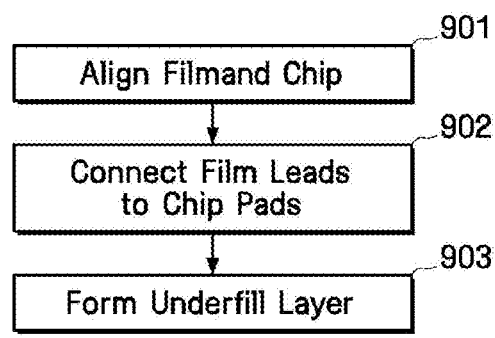
FIG. 9 is a block diagram illustrating an exemplary method of manufacturing a TAB package in accordance with the disclosed embodiments.

FIG. 9 describes an exemplary method of manufacturing a TAB package, in accordance with the disclosed embodiments. In step 901, a semiconductor chip, such as semiconductor chip 1 depicted in FIGS. 1-4, is aligned with a film, such as the film 2 depicted in FIGS. 5-7. The chip is aligned, such that the input and output pads align with ends of input and output lead lines of the film, in step 902, the lead lines are connected to the pads (e.g., by direct or indirect physical contact, by fusing, bonding, or other connection means). In step 903, an underfill layer made of for example, resin, may be formed between the film and the semiconductor chip. Though steps 2 and 3 are described in a particular order, they need not occur in that order, and may occur simultaneously, or in a different order. In addition, other steps known in the art (not shown) may occur in the process of manufacturing the TAB package.

FIGS. 10A-10D illustrate different exemplary configurations of input/output pads and leads of a TAB package, consistent with different disclosed embodiments.

Figure 10A:
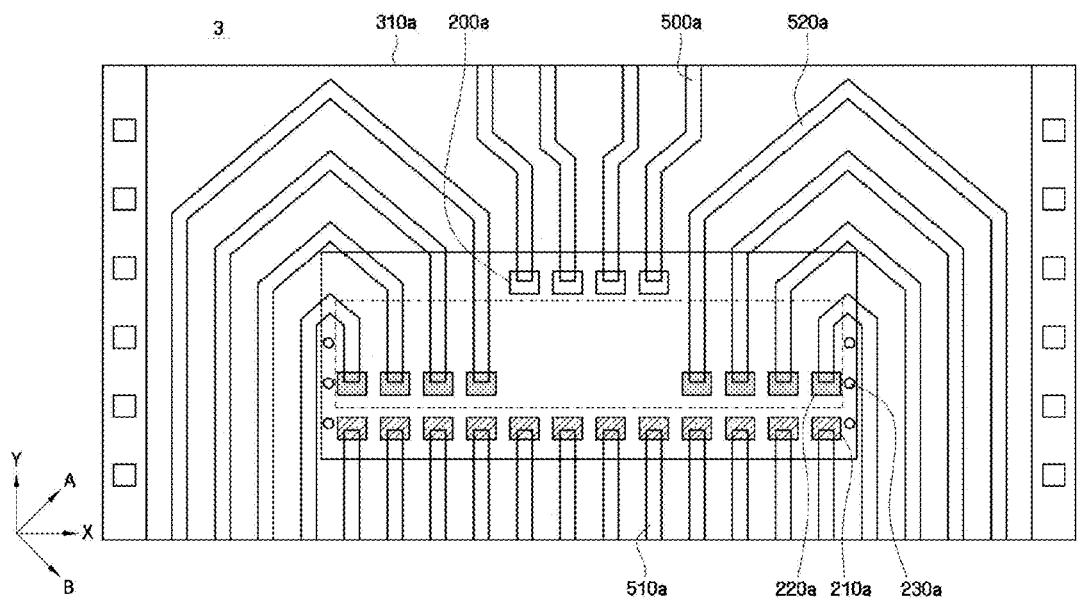
FIGS. 10A-10D are diagrams illustrating exemplary alternative arrangements of input/output pads and leads of a TAB package, according to exemplary embodiments.

For example, FIG. 10A depicts an exemplary TAB package including a semiconductor chip including input pads 200a, first output pads 210a, second output pads 220a, and optional additional conductive elements 230a. In one embodiment, input pads 200a, first output pads 210a, second output pads 220a may be arranged in a manner similar to that shown in FIG. 7, and optional additional conductive elements 230a may include pads or other conductive elements adjacent short-side edges of the connection surface of semiconductor chip. In the embodiment shown in FIG. 10A, input leads 500a and first output leads 510a of a film are arranged in a manner similar to that shown in FIG. 7, and input leads 520a may be configured such that lowest-most leads (e.g., furthest leads from an input terminal 310a of the film) have bent portions that bend around an area where optional additional conductive elements 230a may be located, and second straight portions that are outside the chip mounting area of the film. That is, additional pads may be included on the connection surface of the semiconductor chip adjacent a short-side edge of the semiconductor chip, and leads of the film may be bent around the additional pads such that bent portions of the lowest-most of the leads (e.g., furthest from the input terminal 310a) remain above the upper-most of the additional pads (e.g., closest to the input terminal 310a).

Figure 10B:
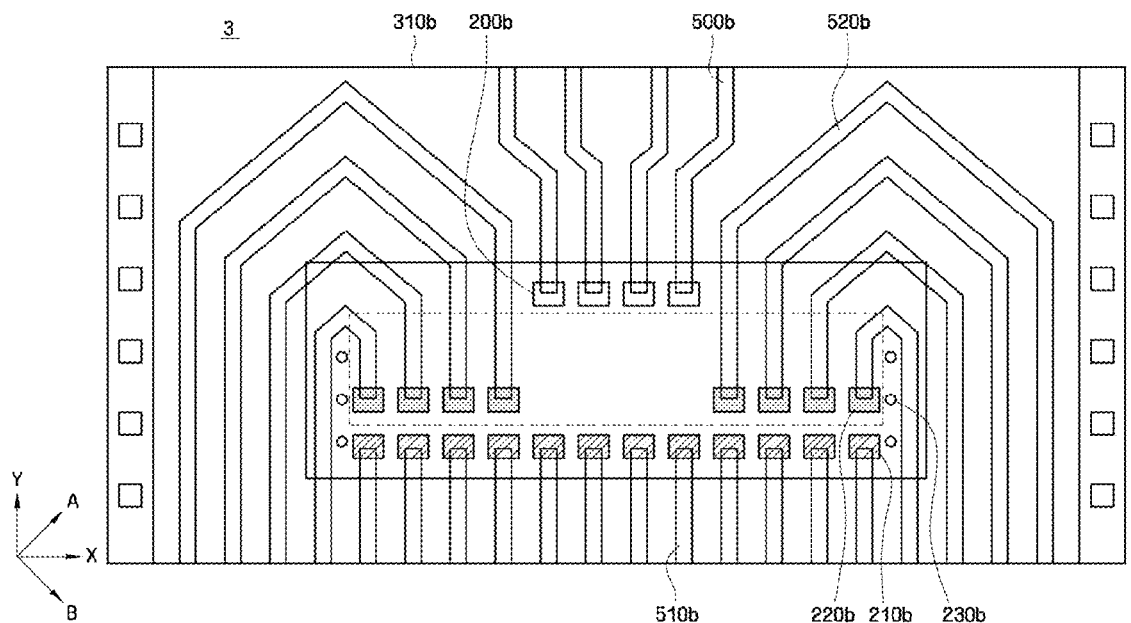

FIG. 10B depicts an exemplary TAB package including a semiconductor chip including input pads 200b, first output pads 210b, second output pads 220b, and optional additional conductive elements 230b. In one embodiment, input pads 200b, first output pads 210b, second output pads 220b may be arranged in a manner similar to that shown in FIG. 7, and optional additional conductive elements 230b may include pads or other conductive elements aligned along short-side edges of the connection surface of semiconductor chip. In the embodiment shown in FIG. 10B, input leads 500b and first output leads 510b of a film are arranged in a manner similar to that shown in FIG. 7, and input leads 520b may be configured such that lowest-most leads (e.g., furthest leads from an input terminal 310b of the film) have bent portions that bend around an area where optional additional conductive elements 230b may be located, and second straight portions that are inside the chip mounting area of the film, adjacent the edges of the chip mounting area. That is, additional pads may be included on the connection surface of the semiconductor chip aligned along short-side edges of the semiconductor chip, and leads of the film may be bent around the additional pads such that bent portions of the lowest-most of the leads (e.g., furthest from the input terminal 310b) remain above the upper-most of the additional pads (e.g., closest to the input terminal 310b).

Figure 10C:
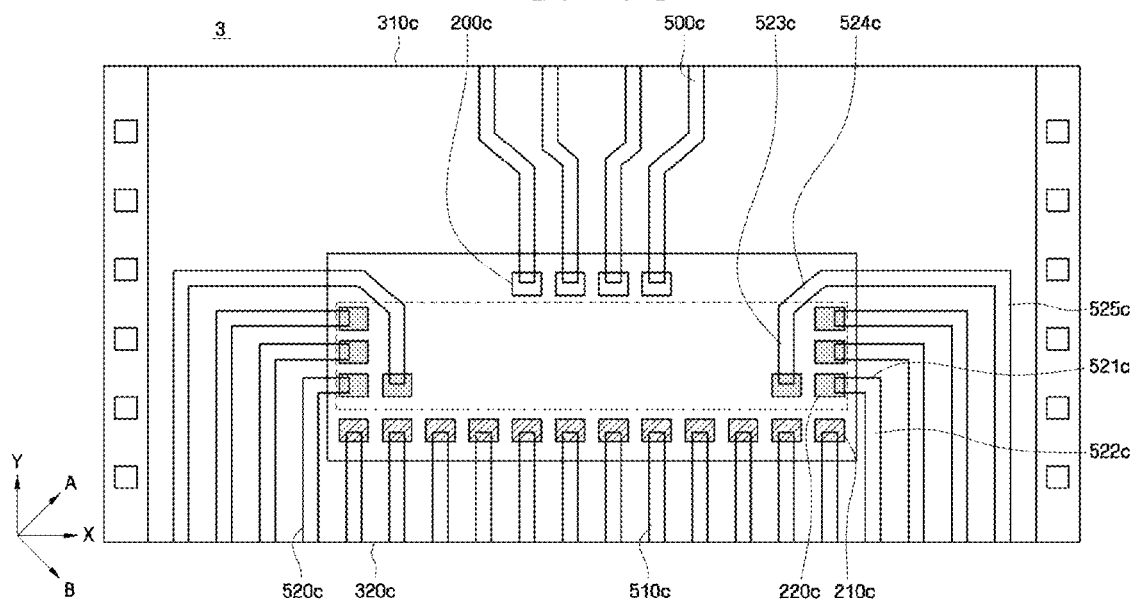

FIG. 10C depicts an exemplary TAB package including a semiconductor chip including input pads 200c, first output pads 210c, and second output pads 220c. In this embodiment, input pads 200c and first output pads 210c may be arranged in a manner similar to that shown in FIG. 7, but no additional conductive elements are included adjacent short-side edges of the semiconductor chip, and second output pads 220c are arranged such that at least two outer second output pads are arranged adjacent each short-side edge of the semiconductor chip, and at least a third inner second output pad is arranged along each short-side edge, further toward the center of the semiconductor chip than the at least two outer pads. In this embodiment, input leads 500c and first output leads 510c of a film are arranged in a manner similar to that shown in FIG. 7, and input leads 520c may be configured such that leads connected to outer second output pads include a portion 521c extending toward the short-side edge of a chip-mounting area, and then a portion 522c extending toward the output terminal 320c, while leads connected to inner second output pads bend around the leads connected to outer second output pads and include a first straight portion 523c, a bent portion 524c, and a second straight portion 525c. In this additional embodiment, because the leads connected to some of the second output pads 220c do not extend toward the input terminal 310c, additional space may be saved for the film, and the TAB package may be made smaller.

Figure 10D:
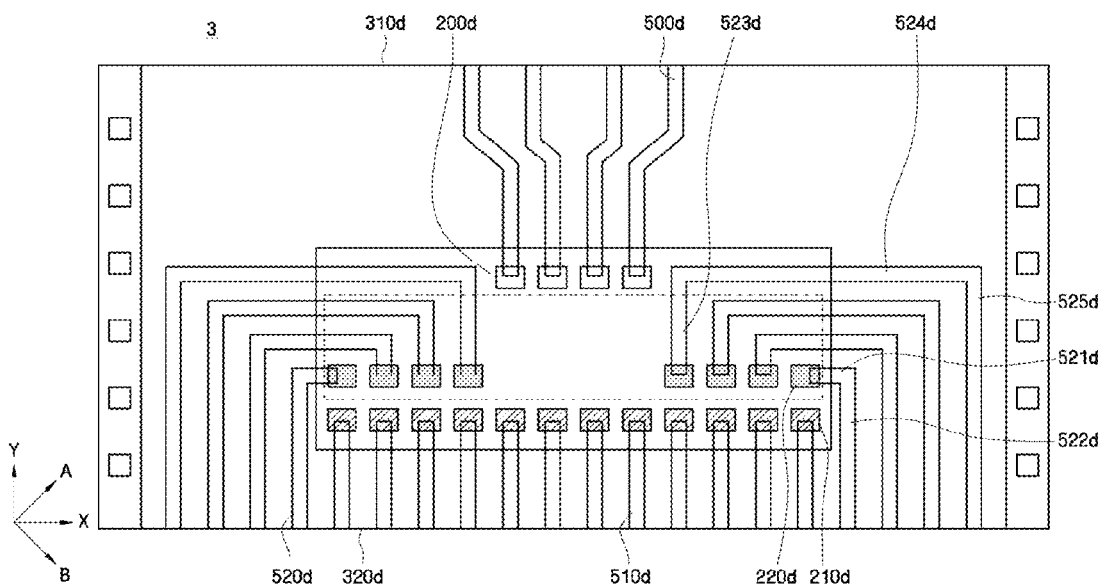

FIG. 10D depicts an exemplary TAB package including a semiconductor chip including input pads 200d, first output pads 210d, and second output pads 220d. In this embodiment, input pads 200d, first output pads 210d, and second output pads 220d may be arranged in a manner similar to that shown in FIG. 7, but no additional conductive elements are included adjacent short-side edges of the semiconductor chip. In this embodiment input leads 500d and first output leads 510d of a film are arranged in a manner similar to that shown in FIG. 7, and input leads 520d may be configured such that a lead connected to outer second output pads include a portion 521d extending toward the short-side edge of a chip-mounting area and then a portion 522d extending toward the output terminal 320d, while leads connected to inner second output pads bend around the leads connected to outer second output pads and include a first straight portion 523d, second straight portion 524d, and third straight portion 525d. In this additional embodiment, because the leads connected to some of the second output pads 220d do not extend toward the input terminal 310d, additional space may be saved for the film, and the TAB package may be made smaller.

While the present disclosure has been particularly shown and described with reference to example embodiments thereof, it will be understood by those of ordinary skill in the art that various changes in form and details may be made therein without departing from the spirit and scope of the invention as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor chip for a tape automated bonding (TAB) package, the semiconductor chip comprising:
    a connection surface including a set of input pads connected to internal circuitry of the semiconductor chip and for conveying external signals to the internal circuitry, the set of input pads comprising all of the input pads on the semiconductor chip; and
    the connection surface including a set of output pads connected to internal circuitry of the semiconductor chip and for conveying internal chip signals to outside the semiconductor chip, the set of output pads comprising all of the output pads on the semiconductor chip;
    wherein the connection surface includes a first edge and a second edge that are substantially parallel to each other and are opposite each other on a respective first side and second side of the semiconductor chip, and a third edge and fourth edge that are substantially perpendicular to the first and second edges, and are opposite each other on a respective third side and fourth side of the semiconductor chip;
    wherein a plurality of input pads of the set of input pads are adjacent the first edge, and are arranged in a first row substantially parallel to the first edge and extending in a first direction;
    wherein a plurality of first output pads of the set of output pads are adjacent the second edge, and are arranged in a second row substantially parallel to the second edge and extending in the first direction; and
    wherein a plurality of second output pads of the set of output pads are located between the first row and the second row, and include at least first and second outermost pads located a certain distance from the respective third edge and fourth edge such that no pads at the connection surface are closer to the respective third edge and fourth edge than each of the first and second respective outermost pads, and at least first and second inner pads located a greater distance from the respective third edge and fourth edge than the first and second outermost pads.

2. The semiconductor chip of claim 1, wherein the plurality of input pads include all of the pads in the first row.

3. The semiconductor chip of claim 1, wherein the plurality of first output pads include all of the pads in the second row.

4. The semiconductor chip of claim 1, wherein the first outermost pad is located between the first inner pad and the third edge, and the second outermost pad is located between the second inner pad and the fourth edge.

5. The semiconductor chip of claim 1, wherein the first and second outermost pads of the plurality of second output pads are aligned with a first and second outermost pad of the plurality of first output pads, along a direction perpendicular to the first direction.

6. The semiconductor chip of claim 1, wherein the set of output pads includes only the plurality of first output pads and plurality of second output pads.

7. The semiconductor chip of claim 1, wherein the set of input pads includes only the plurality of input pads.

8. The semiconductor chip of claim 1, wherein no output pads are located adjacent the first edge.

9. The semiconductor chip of claim 1, wherein the combined plurality of first output pads and plurality of second output pads comprise at least 80% of the output pads of the set of output pads.

10. The semiconductor chip of claim 1, wherein the plurality of second output pads are located in a third row adjacent to the second row.

11. The semiconductor chip of claim 1, wherein the plurality of second output pads are arranged to be symmetrical to each other with respect to a center line that bisects the connection surface.

12. The semiconductor chip of claim 1, wherein the semiconductor chip is a display driver IC (DDI).

13. A semiconductor chip for a tape automated bonding (TAB) package, the semiconductor chip comprising:
    a connection surface including a set of input pads connected to internal circuitry of the semiconductor chip and for conveying external signals to the internal circuitry, the set of input pads comprising all of the input pads on the semiconductor chip; and
    the connection surface including a set of output pads connected to internal circuitry of the semiconductor chip and for conveying internal chip signals to outside the semiconductor chip, the set of output pads comprising all of the output pads on the semiconductor chip;
    wherein the connection surface includes a first edge and a second edge that are substantially parallel to each other and are opposite each other on a respective first side and second side of the semiconductor chip, and a third edge and fourth edge that are substantially perpendicular to the first and second edges, and are opposite each other on a respective third side and fourth side of the semiconductor chip;
    wherein a plurality of input pads of the set of input pads are adjacent the first edge, and are arranged in a first row substantially parallel to the first edge and extending in a first direction;
    wherein a plurality of first output pads of the set of output pads are adjacent the second edge, and are arranged in a second row substantially parallel to the second edge and extending in the first direction; and
    wherein a plurality of second output pads of the set of output pads are located between the first row and the second row, and include at least first and second outermost pads located a certain distance from the respective third edge and fourth edge and being the closest pads to the respective third edge and fourth edge, and at least first and second inner pads located a greater distance from the respective third edge and fourth edge than the first and second outermost pads.

14. The semiconductor chip of claim 13, wherein the plurality of input pads include all of the pads in the first row.

15. The semiconductor chip of claim 13, wherein the plurality of first output pads include all of the pads in the second row.

16. The semiconductor chip of claim 13, wherein the first outermost pad is located between the first inner pad and the third edge, and the second outermost pad is located between the second inner pad and the fourth edge.

17. The semiconductor chip of claim 13, wherein the first and second outermost pads of the plurality of second output pads are aligned with a first and second outermost pad of the plurality of first output pads, along a direction perpendicular to the first direction.

18. The semiconductor chip of claim 13, wherein the set of output pads includes only the plurality of first output pads and plurality of second output pads.

19. The semiconductor chip of claim 13, wherein the set of input pads includes only the plurality of input pads.

20. The semiconductor chip of claim 13, wherein no output pads are located adjacent the first edge.

21. The semiconductor chip of claim 13, wherein the combined plurality of first output pads and plurality of second output pads comprise at least 80% of the output pads of the set of output pads.

* * * * *